(12) United States Patent
Mestrom et al.

(10) Patent No.: US 9,007,560 B2
(45) Date of Patent: Apr. 14, 2015

(54) RADIATION SOURCE

(75) Inventors: Wilbert Jan Mestrom, Roermond (NL);
Gerardus Hubertus Petrus Maria Swinkels, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 288 days.

(21) Appl. No.: 13/480,944

(22) Filed: May 25, 2012

(65) Prior Publication Data
US 2013/0077069 A1    Mar. 28, 2013

Related U.S. Application Data

(60) Provisional application No. 61/538,688, filed on Sep. 23, 2011.

(51) Int. Cl.
*H05G 2/00*    (2006.01)
*B03C 1/00*    (2006.01)
*G03F 7/20*    (2006.01)

(52) U.S. Cl.
CPC    *H05G 2/005* (2013.01); *B03C 1/00* (2013.01); *G03F 7/70916* (2013.01); *G03F 7/70908* (2013.01); *G03F 7/70033* (2013.01); *H05G 2/006* (2013.01); *H05G 2/008* (2013.01)

(58) Field of Classification Search
CPC .............. B03C 1/00; B03C 1/32; G03F 7/20; G03F 7/10033; G03F 7/70883; G03F 7/70908; G03F 7/70916; H05G 2/00–2/008
USPC .......... 210/222, 695; 239/106; 250/428–435, 250/493.1, 504 R; 313/231.31–231.61; 314/22; 355/30, 67; 378/34
See application file for complete search history.

(56) References Cited

U.S. PATENT DOCUMENTS

2006/0193997 A1 * 8/2006 Bykanov ................. 427/585
2011/0310365 A1 * 12/2011 Yabu et al. ................ 355/30

OTHER PUBLICATIONS

Afshar, M. R., et al., "Modeling of electromagnetic separation o inclusions from molten metals," International Journal of Mechanical Sciences, vol. 52, No. 9, 2010; pp. 1107-1114.
Asai, S., "Recent development and prospect of electromagnetic processing of materials," Science and Technology of Advanced Materials, vol. 1, No. 4, 2000; pp. 191-2000.
(Continued)

*Primary Examiner* — Colin Kreutzer
(74) *Attorney, Agent, or Firm* — Sterne, Kessler, Goldstein & Fox P.L.L.C.

(57) ABSTRACT

A radiation source is disclosed that comprises a reservoir that retains a volume of fuel, a nozzle configured to direct a stream of fuel towards a plasma formation location, a laser configured to generate a radiation generating plasma, and a fuel contamination control arrangement. The contamination control arrangement comprises a magnetic field generation element for generating a magnetic field; an electric field generation element for generating an electric field, the magnetic field generation element and the electric field generation element together configured to ensure that the magnetic field and the electric field overlap at a location of contamination within the fuel, and to ensure that lines of flux of the magnetic field and electric field are non-parallel at that location to control movement of the contamination.

13 Claims, 8 Drawing Sheets

(56) References Cited

OTHER PUBLICATIONS

Shu, D., et al., "Study of Electromagnetic Separation of Nonmetallic Inclusions from Aluminum Melt," Metallurgical and Materials Transactions A, vol. 30A, Nov. 1999; pp. 2979-2988.

Taniguchi, S., et al., "Application of EPM to the Separation of Inclusion Particles from Liquid Metal," The $15^{th}$ RIGA and $6^{th}$ PAMIR Conference on Fundamental and Applied MHD, Invited Lectures, Jun. 27-Jul. 1, 2005; pp. 55-63.

* cited by examiner

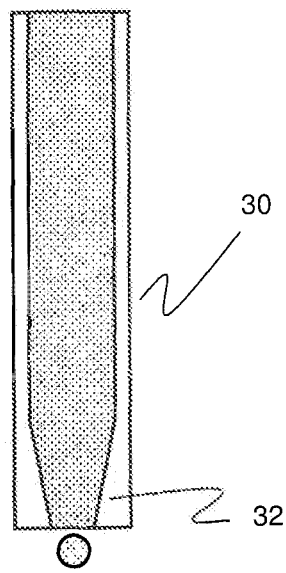 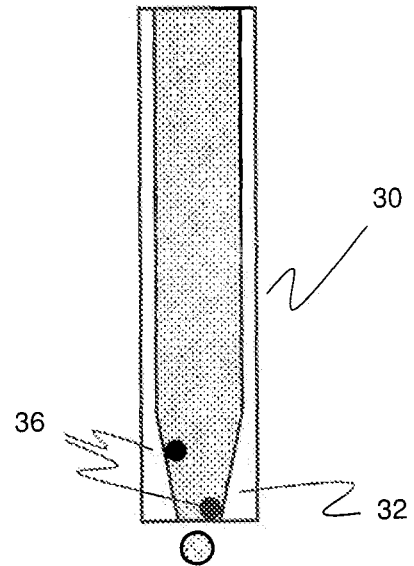
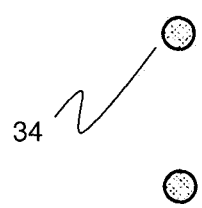 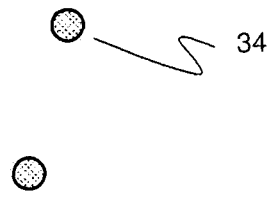
FIG. 3  FIG. 4

RADIATION SOURCE

CROSS REFERENCE TO RELATED APPLICATIONS

This application claims the benefit under 35 U.S.C. §119 (e) to U.S. Provisional Patent Application No. 61/538,688, filed Sep. 23, 2011, which is incorporated by reference herein in its entirety.

FIELD

The present invention relates to a radiation source, suitable for use in conjunction with, or forming part of, a lithographic apparatus. The present invention also relates more generally to an arrangement for generating a stream of fluid, and to a method of controlling contamination within such an arrangement.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

A proposed LPP radiation source generates a continuous stream of fuel droplets. The radiation source comprises a nozzle for directing fuel droplets toward a plasma formation location. The droplets need to be directed to the plasma formation location with a high degree of accuracy in order to ensure that a laser beam may be directed toward and into contact with the droplets. In order to achieve this, fuel should pass through the nozzle without encountering any unexpected or unintentional obstructions or restrictions. Such obstructions or restrictions may result from contamination in the fuel being deposited on an internal surface of the nozzle. The contamination can result in a stream of droplets directed by the nozzle not having one or more required properties, for example a desired trajectory or a desired droplet size, shape or frequency. As a result, this can lead to the radiation source as a whole not functioning as intended, for example not being able to generate radiation, or not being able to generate radiation of the required intensity or for a required duration.

Although problems have been described in relation to nozzles used in LPP radiation sources, the same or similar problems may be encountered in conjunction with nozzles used in other fluid (e.g., liquid) stream generators (droplet or continuous), for example nozzles used in ink-jet printing or the like. Also, the problems are not restricted to a stream comprising droplets—the same or similar problems may be encountered when a continuous stream is to be generated.

SUMMARY

It is desirable to obviate or mitigate at least one problem of the prior art, whether identified herein or elsewhere, or to provide an alternative to existing apparatus or methods.

According to a first aspect of the invention, there is provided a radiation source comprising: a reservoir configured to retain a volume of fuel; a nozzle, in fluid connection with the reservoir, and configured to direct a stream of fuel along a trajectory towards a plasma formation location; a laser configured to direct laser radiation at the stream at the plasma formation location to generate, in use, a radiation generating plasma; and a fuel contamination control arrangement, the contamination control arrangement comprising: a magnetic field generation element for generating a magnetic field; an electric field generation element for generating an electric field; the magnetic field generation element and the electric field generation element together being configured to ensure that, in use, the magnetic field and the electric field overlap at a location, or a potential location, of contamination within the fuel, and to ensure that lines of flux of the magnetic field and electric field are non-parallel at that location, in order to control movement of the contamination.

The fuel contamination control arrangement may be configured to drive contamination away from passing through the nozzle.

The fuel contamination control arrangement may be configured to drive contamination through the nozzle.

The location, or the potential location, of contamination within the fuel is one or more of: within the nozzle, or within a conduit leading from the reservoir to the nozzle; within the reservoir, or within the reservoir and in a vicinity of an opening of the nozzle, or within the reservoir and in a vicinity of an opening of a conduit leading from the reservoir to the nozzle; within a further reservoir upstream of the reservoir, or within the further reservoir and in a vicinity of an opening of a conduit leading to the reservoir, or within a conduit leading to the reservoir. The magnetic field generation element and/or the electric field generation element may be appropriately located or distributed about or around this location, or potential location.

The nozzle, and/or a conduit leading to the nozzle, may comprise or be in connection with an electromechanical agitator for causing vibration of the nozzle, or fluid contained therein. The electromechanical agitator may be shielded from external electric and/or magnetic fields (i.e., by a shield).

The magnetic field generation element may comprise: a solenoid that surrounds the location, or the potential location, of contamination within the fuel (e.g., for generating a constant or variable magnetic field); and/or one or more permanent magnets (for generating a constant magnetic field).

The electric field generation arrangement may comprise one or more of: an electrode; or two electrodes; or two electrodes located on substantially opposite sides of the location, or the potential location, of contamination within the fuel; or a capacitor, opposite plates of which capacitor are located on substantially opposite sides of the location, or the potential location, of contamination within the fuel.

The magnetic field generation element and/or the electric field generation element may be configured to ensure that, in use, the magnetic field and/or the electric field provide a substantially uniform magnetic field and/or electric field at the location, or the potential location, of contamination within the fuel.

According to a second aspect of the invention, there is provided a lithographic apparatus comprising: an illumination system for providing a radiation beam; a patterning device for imparting the radiation beam with a pattern in its cross-section; a substrate holder for holding a substrate; a projection system for projecting the patterned radiation beam onto a target portion of the substrate, and wherein the lithographic apparatus further comprises, or is in connection with, the radiation source of any aspect of the invention.

According to a third aspect of the invention, there is provided a fluid stream generator, comprising: a reservoir configured to retain a volume of fluid; a nozzle, in fluid connection with the reservoir, and configured to direct a stream of fluid along a trajectory; and a fluid contamination control arrangement, the contamination control arrangement comprising: a magnetic field generation element for generating a magnetic field; an electric field generation element for generating an electric field; the magnetic field generation element and the electric field generation element together being configured to ensure that, in use, the magnetic field and the electric field overlap at a location, or a potential location, of contamination within the fluid, and to ensure that lines of flux of the magnetic field and electric field are non-parallel at that location, in order to control movement of the contamination.

According to a fourth aspect of the invention, there is provided a method of contamination control in a fluid stream generator, the arrangement comprising: a reservoir configured to retain a volume of fluid; and a nozzle, in fluid connection with the reservoir, and configured to direct a stream of fluid along a trajectory; the method comprising: controlling movement of the contamination by establishing a magnetic field and an electric field that overlap at a location, or a potential location, of contamination within the fluid, lines of flux of the magnetic field and electric field being non-parallel at that location in order to induce movement of the fluid to, in turn, control movement of the contamination contained within the fluid.

According to a fifth aspect of the invention, there is provided a radiation source comprising: a reservoir configured to retain a volume of fuel; a nozzle, in fluid connection with the reservoir, and configured to direct a stream of fuel along a trajectory towards a plasma formation location; a laser configured to direct laser radiation at the stream at the plasma formation location to generate, in use, a radiation generating plasma; and a fuel contamination control arrangement, the contamination control arrangement comprising: a magnetic field generation element for generating a magnetic field; and/or an electric field generation element for generating an electric field; the magnetic field generation element and/or the electric field generation element being configured to ensure that the generated magnetic field and/or electric field is present at a location, or a potential location, of contamination within the fluid to control movement of the contamination.

According to a sixth aspect of the invention, there is provided a fluid stream generator, comprising: a reservoir configured to retain a volume of fuel; a nozzle, in fluid connection with the reservoir, and configured to direct a stream of fuel along a trajectory; and a fuel contamination control arrangement, the contamination control arrangement comprising: a magnetic field generation element for generating a magnetic field; and/or an electric field generation element for generating an electric field; the magnetic field generation element and/or the electric field generation element being configured to ensure that the generated magnetic field and/or electric field is present at a location, or a potential location, of contamination within the fluid to control movement of the contamination.

According to a seventh aspect of the invention, there is provided a method of contamination control in a fluid stream generator, the arrangement comprising: a reservoir configured to retain a volume of fluid; and a nozzle, in fluid connection with the reservoir, and configured to direct a stream of fluid along a trajectory; the method comprising: controlling movement of the contamination by establishing a magnetic field and/or an electric field at a location, or at a potential location, of contamination within the fluid to control movement of the contamination contained within the fluid.

One of the magnetic field or electric field may be externally applied, with the other being induced within the fluid/contamination.

According to any one or more aspects of the invention, the fuel or fluid may have a different electrical conductivity in comparison with the contamination.

According to any one or more aspects of the invention, the contamination may be substantially an electrical insulator.

According to any one or more aspects of the invention, the fuel or fluid may comprise metal in liquid form, or an intermetallic of a liquid and a metal, or a ceramic, and/or the contamination may comprise an oxide of such metal, intermetallic or ceramic.

According to any one or more aspects of the invention, the fuel or fluid may be or comprise tin, and/or wherein the contamination may be or comprise tin oxide.

According to any one or more aspects of the invention, the contamination control arrangement might additionally and/or alternatively be used as a filter or purifier within the radiation source. The contamination control arrangement might additionally and/or alternatively be described as a filter or purifier.

It will be appreciated that one or more features described in relation to any one particular aspect of the invention may, where appropriate, be applicable to any other aspect of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 schematically depicts a nozzle of a radiation source configured to direct a stream of fuel droplets along a trajectory towards a plasma formation location;

FIG. 4 schematically depicts contamination deposition on an internal surface of the nozzle of FIG. 3, and an affect on a trajectory of droplets leaving the nozzle;

DETAILED DESCRIPTION

Figure 1:
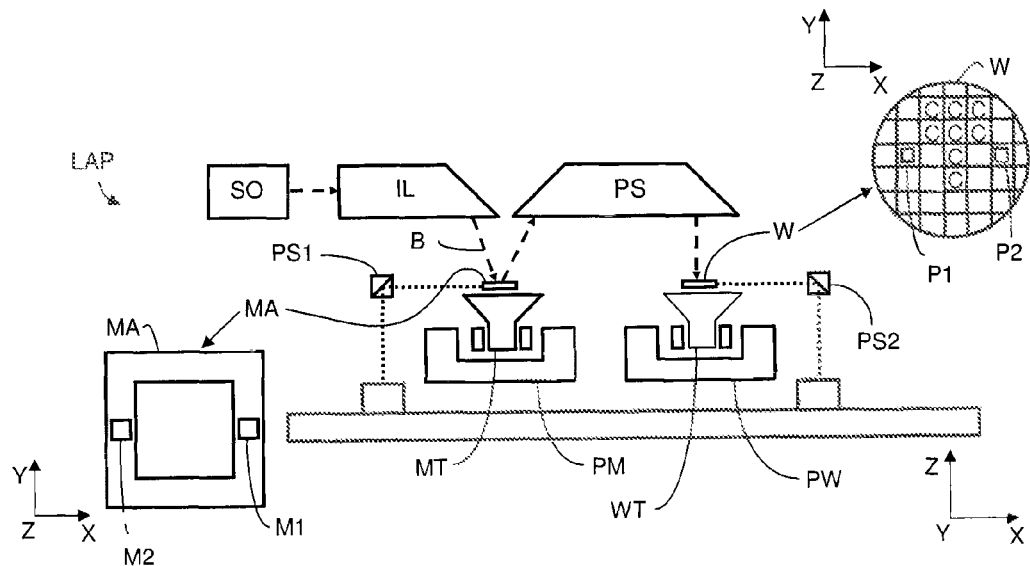
FIG. 1 depicts a lithographic apparatus according to an embodiment of the invention.

FIG. 1 schematically depicts a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
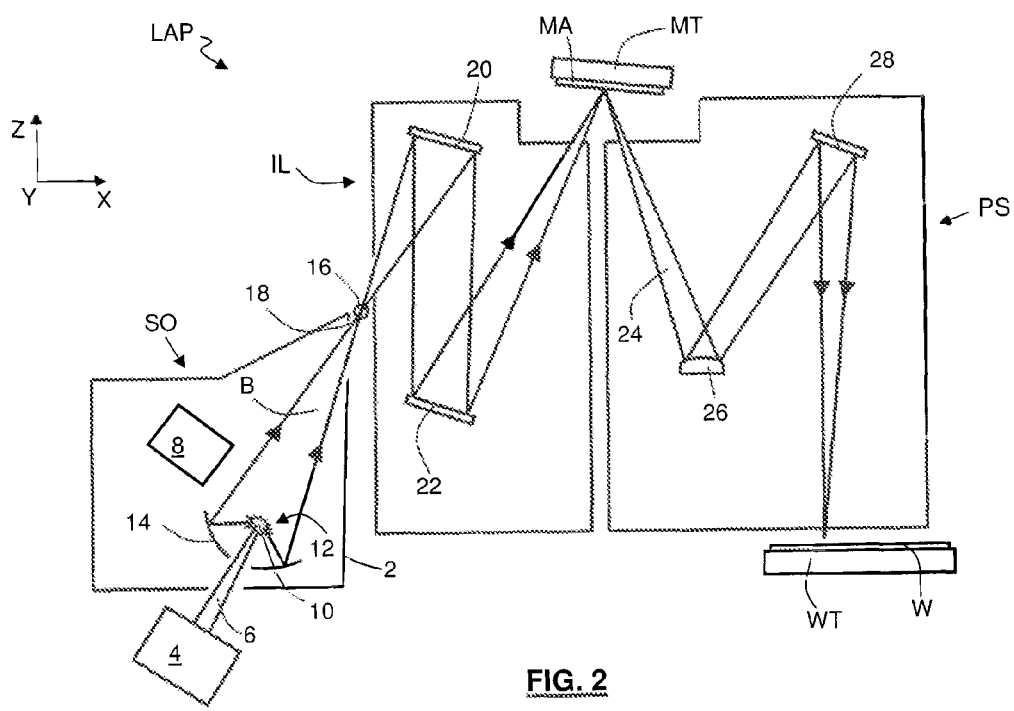
FIG. 2 is a more detailed view of the apparatus of FIG. 1, including an LPP source collector module.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) that is provided from a fuel supply 8 (sometimes referred to as a fuel stream generator). Tin, or another molten metal or intermetallic (most likely in the form of droplets) is currently thought to be the most promising and thus likely choice of fuel for EUV radiation sources. The deposition of laser energy into the fuel creates a highly ionized plasma 10 at a plasma formation location 12 that has electron temperatures of several tens of electronvolts (eV). The energetic radiation generated during de-excitation and recombination of these ions is emitted from the plasma 10, collected and focused by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat the fuel before the laser beam 6 is incident upon it. An LPP source that uses this approach may be referred to as a dual laser pulsing (DLP) source.

Although not shown, the fuel stream generator will comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

FIG. 3 schematically depicts a part of the fuel supply as shown in and described with reference to FIG. 2. The part of the fuel supply is shown as comprising a conduit 30 that includes and leads to a nozzle 32 configured to direct a stream of droplets of fuel 34 along a trajectory towards a plasma formation location (not shown).

Stability and/or clogging (i.e., at least partial blocking) of the nozzle 32 are issues that may arise during use of the nozzle 32, as they do for any ink jet printing application. Clogs will be formed by contamination in the fuel. Clogging of the nozzle 32 may impose a lifetime limit on the nozzle and thus the fuel stream generator (or at least a time limit at which limit replacement, maintenance, or cleaning is required) and may therefore limit the availability of the radiation source or the lithographic apparatus as a whole.

It is most likely that the nozzle 32 of the fuel stream generator will have the smallest, or one of the smallest, diameters as compared to other conduits and the like of a fuel flow system forming part of the fuel stream generator (except, perhaps, for filters present in that system). Since the nozzle 32 will have one of the smallest diameters, it is likely that clogging in the fuel flow system will occur near or at the nozzle 32, and likely within the nozzle 32 that is a restriction in the flow system. It is likely that clogs or the like larger than the nozzle diameter will be filtered out in some way further upstream in the fuel flow system. However, clogs smaller than the nozzle diameter and within the nozzle might result in a change in the effective geometry of the nozzle.

A change in effective geometry may result in a change in the parameters of the generated stream of droplets, for instance the droplet shape or size, or most likely a direction of trajectory of the stream of droplets. In many applications, such parameters will need to meet stringent requirements. In an EUV radiation source in particular, the requirements of the fuel stream generator will be extremely stringent in terms of the trajectory of the droplet stream. For instance, at a plasma formation location, the location of a droplet may need to be accurate to within a few microns, but at the same time the nozzle 32 itself may need to be located relatively far away from the plasma formation location, for instance by a distance of a few tens of centimeters or so. This results in a direction stability requirement of the trajectory of the stream of droplets of perhaps less than 10 microradians. The overall result is that even very small particulate contamination deposited on an internal surface of the nozzle can change the effective geometry of the nozzle to such an extent to ensure that the direction stability requirement is not met. This might, in turn have a detrimental affect on the operation of the radiation source and thus the lithographic apparatus as a whole, for example in terms of the generation of radiation.

FIG. 4 schematically depicts the same conduit 30, nozzle 32 and droplet stream 34 as shown in and described with reference to FIG. 3. However, in FIG. 4 contamination in the form of particles 36 has become deposited on an internal surface of the nozzle 32. Such deposition has resulted in a change in the effective geometry of the nozzle 32 (as described above), which has resulted, in turn, in a change in trajectory of the stream of droplets 34.

The particles 36 are one example of contamination. The contamination could be particulate in form, or be anything else that might be present within the fuel used to form the droplet stream 34 (e.g., flakes, agglomerations, or the like). The contamination could arise from oxidisation of the fuel. For example, if the fuel is tin, the contamination may be tin oxide particles or the like. Alternatively and/or additionally, the contamination could be particles or the like of materials from apparatus used upstream within the fuel flow system. The contamination could be material from a reservoir configured to retain fuel (or oxides of such material), or a filter present in a fuel flow path.

It is an object of the present invention to prevent the nozzle from being clogged with contamination, thus resulting in a change of effective geometry of the nozzle. One proposed solution would be to use fine or finer filters in the fuel flow system to prevent contamination with an average diameter smaller than the nozzle diameter (i.e., the opening of the nozzle) from reaching the nozzle. However, this may then result in a blockage of the fuel flow system as a whole (i.e., at that filter), which could again result in the need to regularly maintain or repair the fuel stream generator, causing significant downtime of the radiation source and/or the lithographic apparatus as a whole. The present invention provides an alternative approach to the problems identified above, which does not (or at least is less likely to) result in increasing the chances of blockages being formed within the fuel flow system (which includes the nozzle).

According to an aspect of the present invention, there is provided a radiation source. The radiation source comprises a fuel stream generator. The fuel stream generator comprises a reservoir configured to retain a volume of fuel, and a nozzle, in fluid connection with the reservoir, configured to direct a stream of fuel (continuous or droplets) along a trajectory towards a plasma formation location. The radiation source also comprises a laser, configured to direct laser radiation at the stream at the plasma formation location to generate, in use, a radiation generating plasma. The radiation source may be distinguished from existing radiation sources in also being provided with a fuel contamination control arrangement. The fuel contamination control arrangement comprises a magnetic field generation element for generating a magnetic field. Also provided is an electric field generation element for generating an electric field. The magnetic field generation element and the electric field generation element are together configured to ensure that, at least in use, the magnetic field and electric field overlap at a location, or at a potential location, of contamination within the fuel. The elements are also configured to ensure that lines are flux of the magnetic field and electric field are non-parallel with respect to one another at that location, in order to control movement of the contamination.

The fuel contamination control arrangement may be configured to drive contamination away from passing through the nozzle (e.g., the arrangement may prevent contamination flowing towards and through the nozzle). This may allow contamination to be retained, for example, in the reservoir, thus preventing the contamination from entering the perhaps more contamination sensitive regions of the radiation source, for example in the vicinity of and including the plasma formation location, and/or any radiation collector or collection surface. Alternatively, the fuel contamination control arrangement may be configured to drive contamination through the nozzle, which may still prove useful in preventing build up of contamination within the nozzle. In either configuration, the arrangement at least assists in preventing build up of contamination within the nozzle, allowing the nozzle to remain in a satisfactory operating condition.

The core of the present invention does not lie in the physics or other principles by which movement of contamination is controlled. Instead, the present invention lies in the application of these principles to a radiation source comprising a fluid stream generator, or to a fluid stream generator in general. The principles by which the movement of the contamination may be controlled are shown in, for example, the following paper: "Migration of an insulating particle under the action of uniform ambient electric and magnetic fields," J. Fluid Mech. (2002), vol. 464, pp. 279-286., H. K. Moffatt and A Sellier. As acknowledged and discussed in this paper, it has been shown both theoretically and experimentally that a particle immersed in, for example, a liquid metal of different conductivity would be forced to migrate relative to the liquid through the combined influence of applied electric and magnetic fields. The current that is driven by the electric field interacts with the magnetic field to produce a rotational Lorentz force. This drives a flow of the liquid that exerts a viscous stress on the particle causing it to move to the remote liquid. Reference may be made to this paper, and for example other papers referenced therein, to determine the physical principles underlying the control of particle (e.g., contamination) movement. The present invention lies in the application of these principles, as will now be discussed in detail below with reference to FIGS. 5 to 10. In FIGS. 5 to 10, the same features have been given the same reference numerals for consistency and clarity. The Figures have not been drawn to any particular scale.

Figure 5:
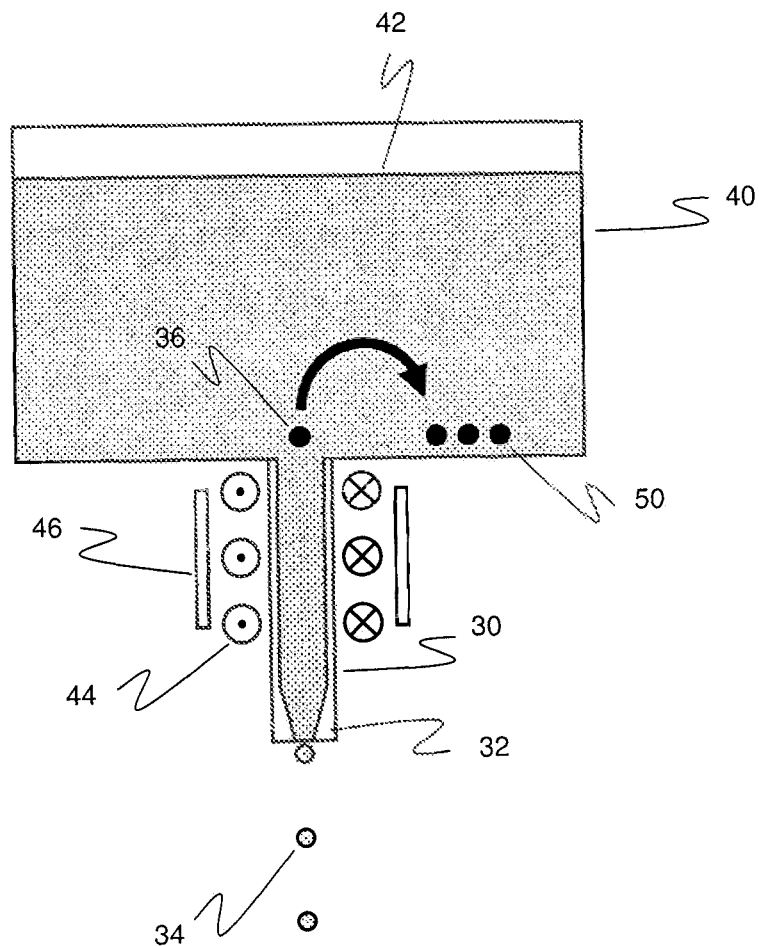
FIG. 5 schematically depicts a fluid stream generator comprising a fluid contamination control arrangement, in accordance with an embodiment of the present invention.
Figure 6:
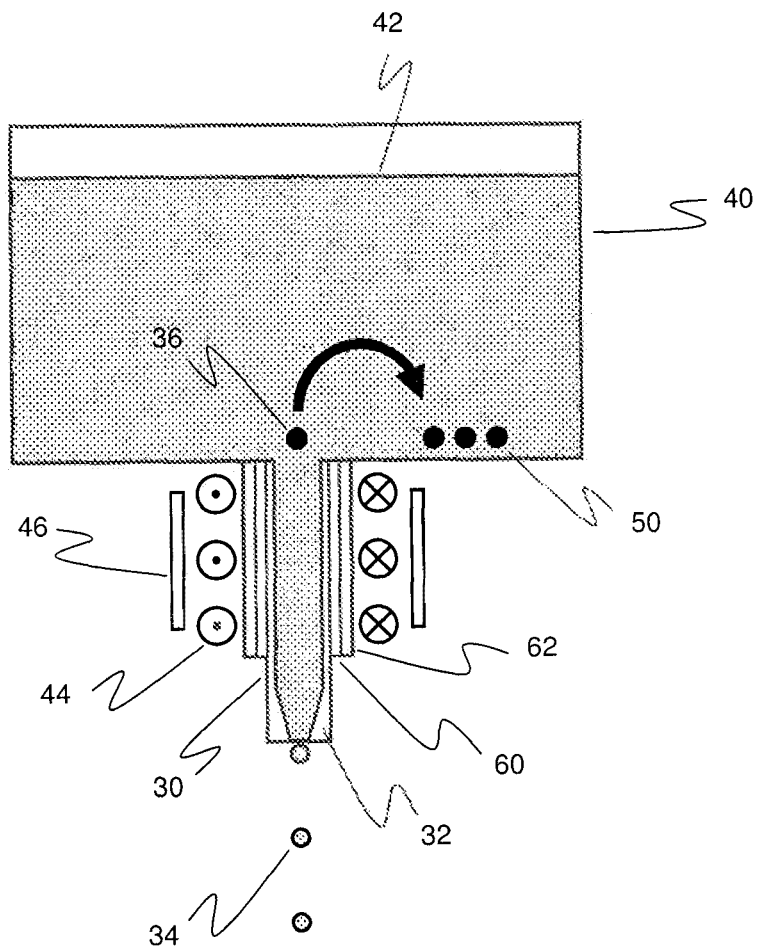
FIG. 6 schematically depicts a fluid stream generator comprising a fluid contamination control arrangement, in accordance with another embodiment of the present invention.
Figure 7:
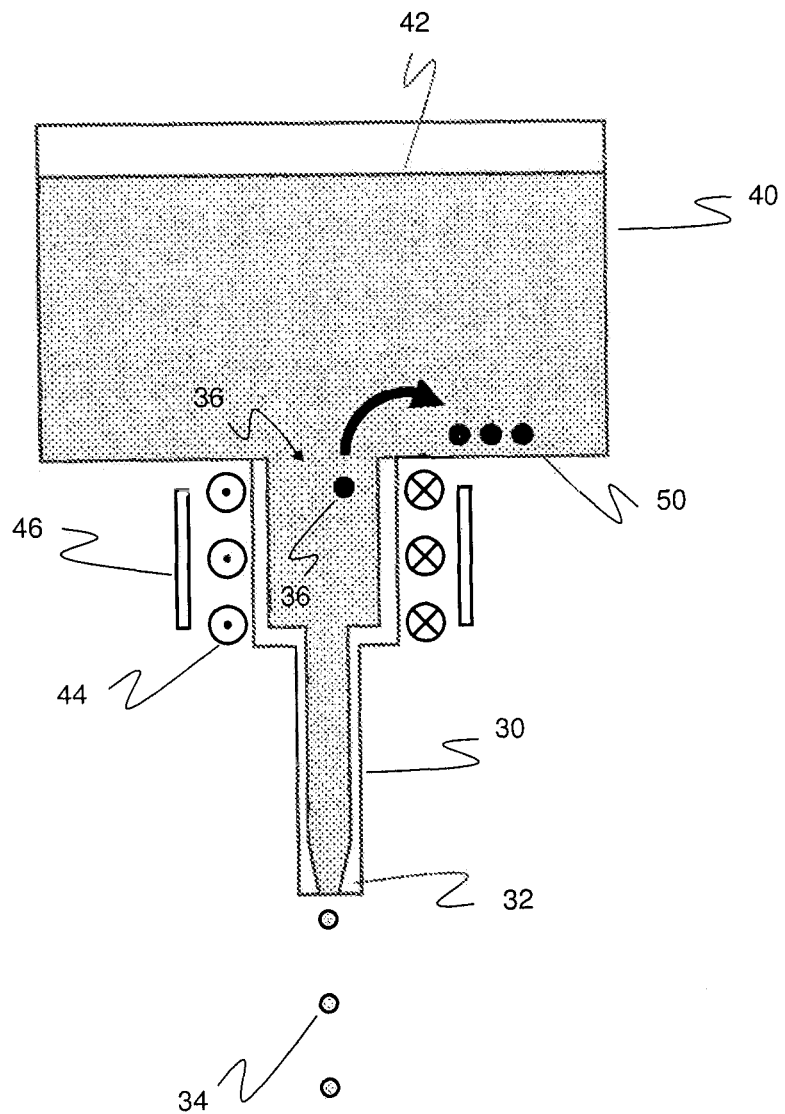
FIG. 7 schematically depicts a fluid stream generator comprising a fluid contamination control arrangement, in accordance with another embodiment of the present invention.
Figure 8:
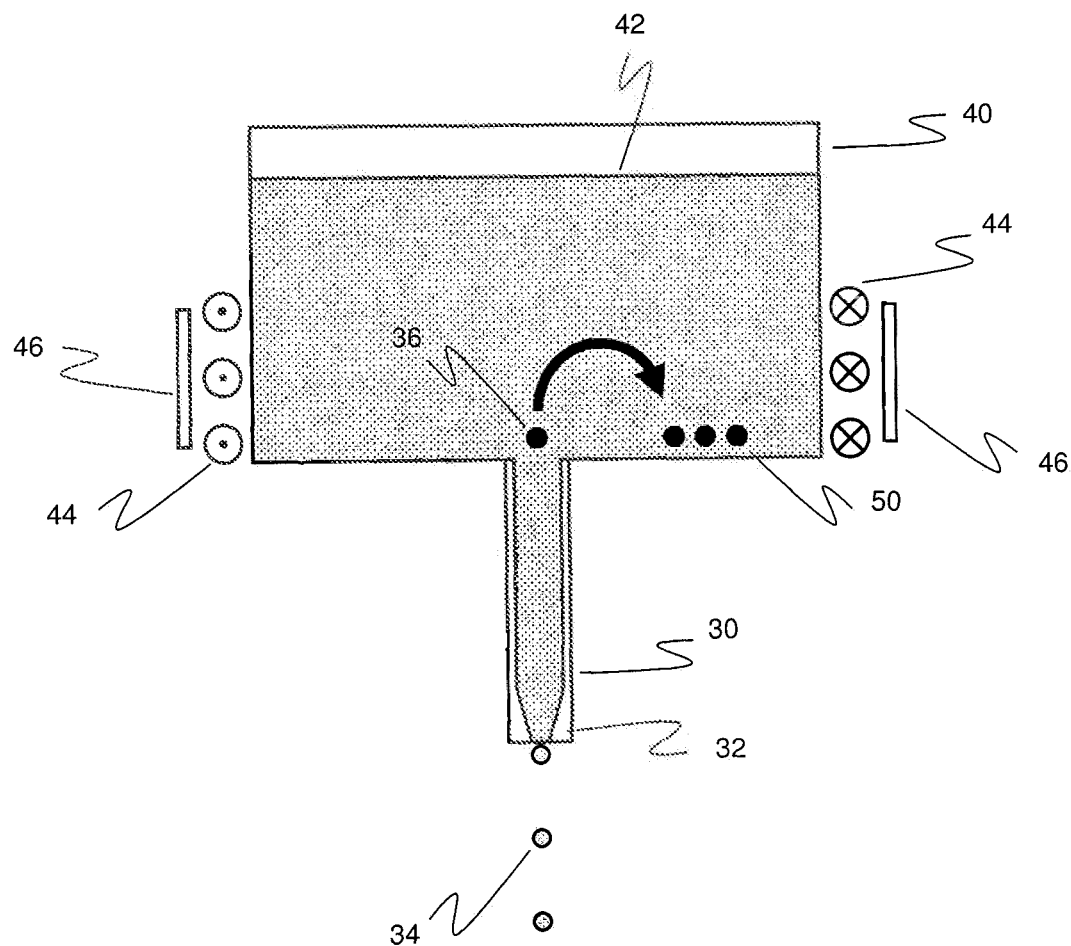
FIG. 8 schematically depicts a fluid stream generator comprising a fluid contamination control arrangement, in accordance with another embodiment of the present invention.
Figure 9:
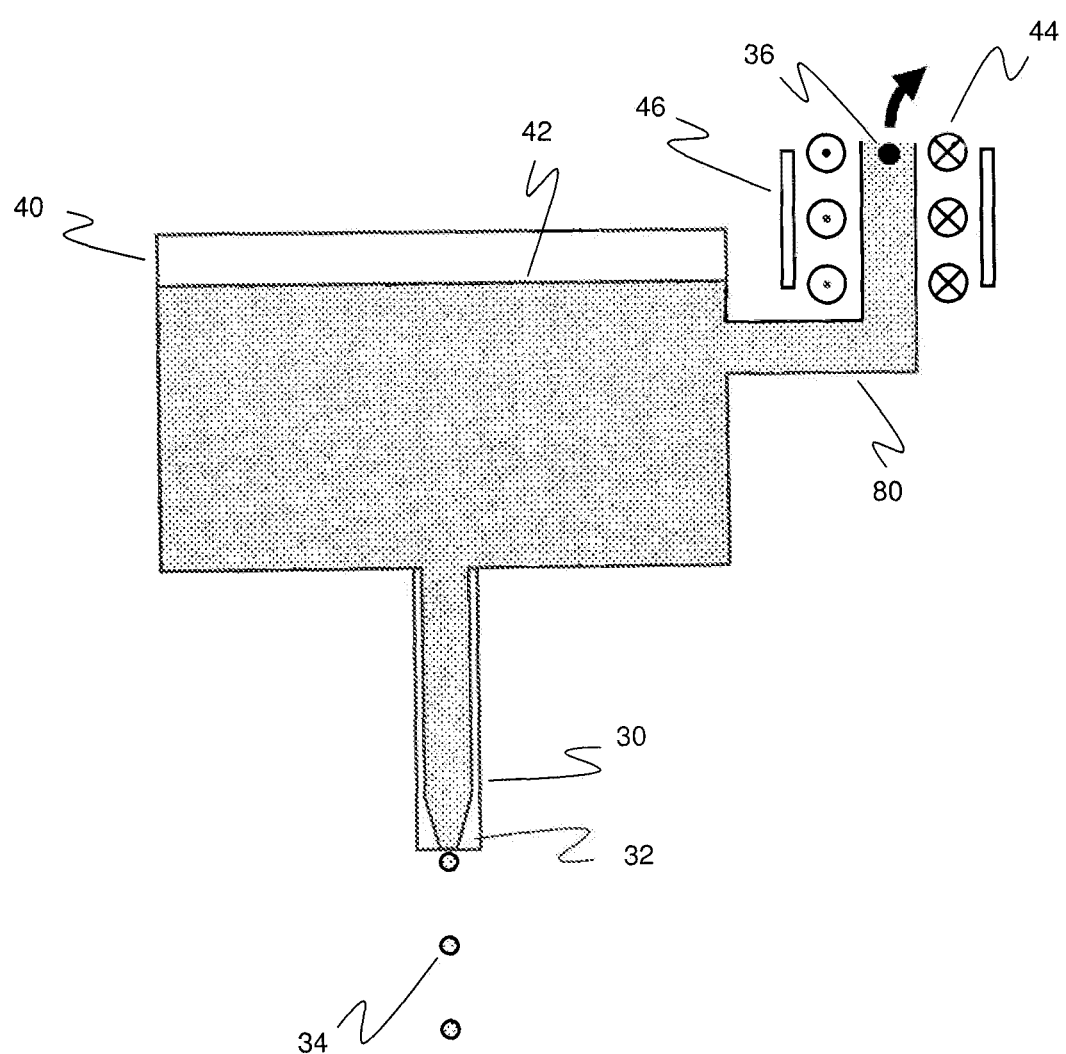
FIG. 9 schematically depicts a fluid stream generator comprising a fluid contamination control arrangement, in accordance with another embodiment of the present invention.
Figure 10:
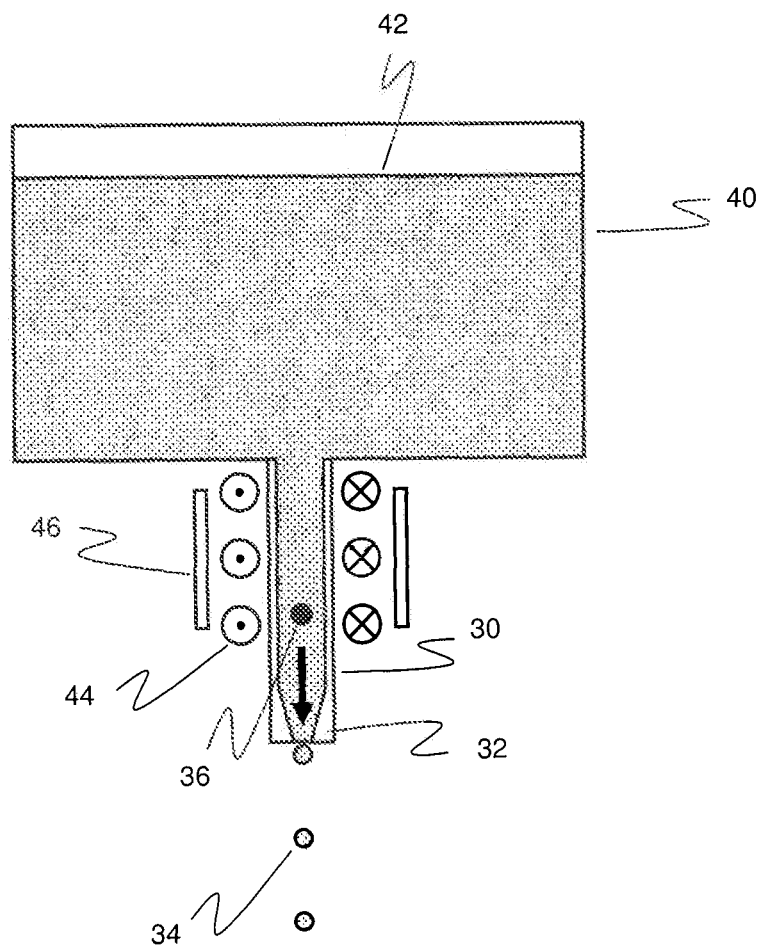
FIG. 10 schematically depicts a fluid stream generator comprising a fluid contamination control arrangement, in accordance with another embodiment of the present invention.

FIG. 5 schematically depicts a fluid stream generator of a radiation source, in accordance with an embodiment of the present invention. The fluid stream generator comprises a reservoir 40 configured to retain a volume of electrically conductive fuel 42 used in the generation of radiation (e.g., liquid tin). The reservoir 40 is in fluid connection with (i.e., able to supply fuel to) the conduit 30 and nozzle 32 already shown in and described with reference to FIGS. 3 and 4 above. Referring back to FIG. 5, pressure may be applied to the fuel 42 (e.g., mechanical or fluid pressure) to force ejection of fuel 42 through the nozzle 32.

The fluid stream generator is also provided with a fuel contamination control arrangement. The fluid contamination control arrangement comprises a magnetic field generation element 44. In this embodiment, the magnetic field generation arrangement takes the form of a solenoid 44 surrounding the nozzle 32 and/or conduit 30. Fuel 42 within the nozzle 32 and/or conduit 30 may itself form at least a part of the magnetic field generation element. An electric field generation element is also provided which, in this embodiment, takes the form of two electrodes 46 located either side of the nozzle 32 and/or conduit 30.

The magnetic field generation element 44 and the electric field generation element 46 are configured to ensure that, at least in use, the magnetic field and the electric field overlap at a location, or at a potential location, of contamination 36 within the fuel 42. The potential location could, for example, be downstream of a source of contamination and/or in an expected flow path of contamination in the absence of the fuel contamination control arrangement. The location could be a point, a region, a volume, or the like. The magnetic field generation element and the electric field generation element are also, together, configured to ensure that lines of flux of the magnetic field and electric field are non-parallel at the location, or at the potential location of the contamination, in order to control movement of the contamination, in accordance with principles described in more detail in the above-reference paper. In general, in order to control movement a force needs to be established, which force is dependent on the cross product of the electric and magnetic fields. This force would be zero if the lines of flux were parallel to one another. Specifically, current that is driven in the fuel 42 by the electric field interacts with the magnetic field to produce a rotational Lorentz force on the fluid 42. This drives a flow that exerts a viscous stress on, for example, particulate contamination 36, causing the contamination 36 to move relative to the fuel 42. The movement can be such that the contamination 36 is move to a contamination dump 50 or the like within the reservoir 40.

In use, and according to the principles discussed above, a flow of fluid within the nozzle 32 or conduit 30 is generated that drives contamination 36 away from the nozzle 32 and/or conduit 30 and back into the reservoir 40 (or prevents such contamination 36 from entering the nozzle 32 and/or conduit 30). This ensures that contamination 36 cannot enter into and pass through the conduit 30 and/or nozzle 32. This either prevents contamination 36 from being deposited within the nozzle 32 and/or conduit 30, which could change the effective geometry of either, and/or prevents contamination 36 entering potentially more contamination sensitive regions of the radiation source.

In this embodiment, the solenoid 44 surrounds the location, or potential location, of contamination within the fuel 42, and the two electrodes 46 are located either side of the location. In this instance, that location is within the nozzle 32, and/or within the conduit 30 leading from the reservoir 40 to the nozzle 32. The nozzle 32 and/or conduit 30 leading to that nozzle 32 is likely to be relatively small (e.g., in terms of cross-section or passage diameter) in comparison with, for example, dimensions of the reservoir 40. Thus, a smaller magnetic field generation arrangement and/or electric field generation arrangement (and/or smaller currents or field strengths or the like), may be required when implementing the invention in this manner, as opposed to where, for example, the location is in a larger body such as the reservoir 42. Different configurations are, however, and of course, possible, as will be discussed in more detail below in relation to other Figures depicting other embodiments.

The magnetic field generation arrangement has been described as comprising a solenoid that surrounds the location, or the potential location, of contamination within the fuel. The magnetic field generation arrangement might additionally comprise driving electronics or other components for providing the solenoid with a flow of electrical current, and/or for ensuring that a sufficient magnetic field strength is obtained/obtainable. Alternatively and/or additionally, one or more permanent magnets may form a part of the magnetic generation arrangement.

The electric field generation arrangement has been described as comprising two electrodes. The two electrodes may for instance be located at substantially opposite sides of the location, or the potential location of contamination within the fuel. For instance, the electric field generation arrangement may be or at least partially constitute a capacitor, opposite plates of which capacitor are located at substantially opposite sides of the location, or the potential location, of contamination within the fuel. In another embodiment, a single electrode may be used to generate the electric field. The electric field generation arrangement might additionally comprise driving electronics or other components for providing a desired electric potential or electric field strength (e.g., for holding an electrode at a desired potential).

Preferably, the magnetic field generation element and/or the electric field generation element are configured to ensure that, at least in use, the magnetic field and/or the electric field provide is substantially uniform at the location, or potential location, of contamination within the fuel. This may assist in providing the required forces, and control of those forces, in order to drive the desired flow of the fuel and thus movement of the contamination.

Variations on the embodiment shown in and described with reference to FIG. 5 will now be described in relation to FIGS. 6 to 10.

As described above, the electric field generation element and the magnetic field generation element might surround the nozzle, or a conduit leading to that nozzle. However, in some embodiments the nozzle, and/or the conduit leading to the nozzle may comprise or be in connection with an electromechanical agitator (e.g., a piezoelectric element or the like) for causing vibration of the nozzle and/or conduit to, in use, ensure that droplets leave the nozzle (e.g., as opposed to an at least partially continuous stream). The presence of such an agitator may require a slight re-design of the fluid flow generator, as will now be described.

FIG. 6 schematically depicts a fluid stream generator of a radiation source, substantially as shown in and described with reference to FIG. 5. However, the generator of FIG. 6 is shown as additionally comprising an electromechanical agitator 60, as described above. The electromechanical agitator 60 surrounds at least a portion of the conduit 30 leading to the nozzle 32, and possibly at least a portion of the nozzle 32. The electromechanical agitator 60 may be sensitive to, at least, external electric fields, and possibly external magnetic fields. This sensitivity may have a direct effect on the properties of droplets generated at the nozzle 32, for example the size or frequency of droplets.

Without any modification, the presence of the electric field generation element 46 and/or magnetic field generation element 44 may have a direct affect on the operation of the agitator 60, and thus an affect on the properties of droplets generated by the nozzle 32. For this reason, it may be desirable to provide a shield 62 for the agitator 60, in order to shield the agitator 60 from external electric and/or magnetic fields, for example those provided by the electric field generation element 46 and/or magnetic field generation element 44.

In another embodiment, not shown, the magnetic and/or electric field generating element may be located such that any (or at least a substantial amount of any) field that is generated is spatially separated from an electromechanical agitator, such that the agitator is not influence by such field(s).

FIG. 7 shows an alternative embodiment, in which the electric field generation element 46 and/or the magnetic field generation element 44 surround a (further, in this embodiment) conduit 70 leading from the reservoir 40 to the nozzle 32. The further conduit 70 may be wider than, for example the nozzle 32 or conduit 30 leading to that nozzle. For example, the conduit 30 might be or form a capillary. The further conduit 70 might be, for example, a (wider) tube or the like.

This configuration has the advantage of the electric field generation element and/or magnetic field generation element surrounding a smaller object than the reservoir 40 itself, thereby allowing a relatively small size of such elements and/or currents or the like used to operate such elements. At the same time, this configuration also avoids problems that might be encountered in surrounding the nozzle 32 or conduit 30 leading to that nozzle 32 (e.g., if the conduit 30 or nozzle 32 comprises, or is in connection with the electromechanical agitator described above).

FIG. 8 shows that, in an alternative embodiment, the electric field generation element 46 and/or magnetic field generation element 44 may surround, or be located at the side of, the reservoir 40. This may allow the overlapping of magnetic and electric fields discussed above to be located within the reservoir 40, or for example and more specifically within the reservoir and within a vicinity of an opening of the nozzle 32, or the reservoir and within a vicinity of a conduit 30 leading from the reservoir 40 to the nozzle 32. This embodiment may have the disadvantage that the electric field generating element 46 and/or magnetic field generation element 44 may have to surround or envelop a larger body (e.g., the reservoir 40), which may result in a larger element and/or higher driving currents, voltages or the like. However, an advantage might be that it might be easier to prevent contamination leaving the reservoir that it is to drive contamination from a smaller space such a conduit or nozzle back in to that reservoir. As such, a smaller force might be required to control movement of the contamination, at least to the extent that contamination is prevented from passing toward the nozzle.

FIG. 9 shows that, in an alternative embodiment, the contamination control may be such that contamination is prevented from entering the reservoir 40. This may be ensured by providing the contamination control arrangement (in the form of the electric field generation element 46 and the magnetic field generation element 44) upstream of the reservoir 40, for example in the vicinity of an opening of a conduit 80 leading to the reservoir 40. In variations on this embodiment (not shown) the contamination control arrangement may be configured to ensure that electric and magnetic fields are provided and configured to overlap: within a further reservoir upstream of the reservoir 40 shown in the Figure; or within the further reservoir and in the vicinity of an opening of a conduit leading to the reservoir 40 shown in the Figure; or within a conduit leading to the reservoir 40 (as shown in the Figure). These embodiments may be beneficial, since they may result in the provision of a reservoir of fuel that is free of contamination. This may allow fewer filters of filtration stages to be present downstream, for example between the reservoir and the nozzle (or within the nozzle). This may lead to a cost and/or maintenance reduction, and/or may allow for increased fuel flow rates or the like (i.e., in the absence of one or more filters).

In another embodiment (not shown), the reservoir could be formed in at least two sections, with a conduit connecting the two sections. The electric and magnetic field generation elements could be configured to prevent contamination passing through this conduit and, for instance, into a nozzle in connection with a downstream section of the reservoir.

FIG. 10 shows much the same fuel stream generator and contamination control arrangement as shown in and described with reference to FIG. 5. However, and in contrast to that shown in FIG. 5, in FIG. 10 the contamination control is such that the contamination 36 is driven through and out of the nozzle 32. This change in direction of movement of contamination 36 could be effected simply by changing the direction of current through the solenoid 44 and/or (in other embodiments) by appropriate movement of one or more permanent magnets that may be present in the arrangement. Attempting to drive contamination through the nozzle 32 might only be required, or implemented, when the contamination is not actually blocking the nozzle (i.e., is capable of passing through the nozzle).

Keeping contamination within the fuel flow system (e.g., within a reservoir) is perhaps desirable, to avoid contamination being present within the more sensitive areas of the radiation source and the lithographic apparatus as whole. However, in some circumstances it may be desirable to flush contamination out of the fuel flow system, in which case the embodiment shown in FIG. 10 may be desirable, for example during cleaning of the generator, or the like.

In the Figures, the reservoir, conduit and nozzle are shown as having a substantially vertical orientation. However, other orientations are possible, for example a substantially horizontal orientation, or orientation at another angle.

In the Figures, the nozzle is shown as extending from the reservoir via the conduit. In another embodiment, the nozzle could extend directly from the conduit, or could form a part of the conduit (e.g., the nozzle could be formed in a wall of the conduit).

As already discussed above, physical principles on which the invention is based are known, and are thus not discussed here in more detail. Accordingly, field strengths and the like that may be required to effect the required control of movement of contamination may be derived from theoretical considerations as, for example, shown in the above-mentioned paper and the like. Alternatively and/or additionally, some degree of trial and error, experimentation, modeling or the like may be required to determine the desired or preferred field strengths needed to control contamination movement in an appropriate manner.

Following on from the preceding paragraph, the combined use of an electric and magnetic field may not be necessary. For instance, the invention is more general, and involves the use of an electric field (variable or constant) and/or a magnetic field (variable or constant) to control movement of contamination. An electric field and/or a magnetic field could be generated externally to the fluid, for example using the same sort of apparatus as described above. Alternatively, a magnetic and/or electric field could be induced within the fluid using only an externally applied electric field or an externally applied magnetic field, using the same sort of apparatus as described above. Configurations or arrangements might include, but are not limited to:

1) Simultaneous imposition of direct current and stationary magnetic field;
2) Imposition of alternating (i.e., varying) current (electric field);
3) Simultaneous imposition of alternating (i.e., varying) current and alternating (i.e., varying) magnetic field,
4) Imposition of alternating (i.e., varying) magnetic field,
5) Imposition of moving or alternating (i.e., variable) magnetic field.

A preferred approach might be (2) above, that is simultaneously imposed direct current and stationary magnetic field. This is because this is understood to be one of the most reliable approaches, as discussed in "Modeling Of Electromagnetic Separation Of Inclusions From Molten Metals," International Journal Of Mechanical Sciences, 52 (2010) 1107-1114, M. Reza Afshar, M. Reza Aboutalebi, R. I. L. Guthrie, M. Isac.

An approach of several configurations is that an alternating field induces a counterpart field, i.e., an alternating (i.e., varying) electric field induces an alternating (i.e., varying) magnetic field and vice versa. This means that it is may not be necessary in some configurations to apply both an external electric field and external magnetic field. Again, the two fields can be used move the contamination through the surrounding fluid, for example in a similar manner to that described in more detail in relation to the Figures—i.e., causing movement of the fluid to cause movement of the particle.

Once again, the core of the present invention does not lie in the physics or other principles by which movement of contamination is controlled. Instead, the present invention lies in the application of these principles to a radiation source comprising a fluid stream generator, or to a fluid stream generator in general. Additional or alternative principles by which movement of the contamination may be controlled may be shown in, for example, the following papers, and papers referenced therein, all of which are incorporated herein by reference:

"Application Of EPM To The Separation Of Inclusion Particles From Liquid Metal," The 15th Riga And 6th PAMIR Conference On Fundamental And Applied MHD, S. Taniguchi, N. Yoshikawa, K. Takahashi;

"Study Of Electromagnetic Separation Of Nonmetallic Inclusions From Aluminum Melt," Metallurgical And Materials Transactions A Volume 30a, November 1999-2979, D. Shu, B. D. Sun, J. Wang, T. X. Li, And Y. H. Zhou;

"Recent Development And Prospect Of Electromagnetic Processing Of Materials", Science And Technology Of Advanced Materials 1 (2000) 191-200, S. Asai; and "Modeling Of Electromagnetic Separation Of Inclusions From Molten Metals," International Journal Of Mechanical Sciences, 52 (2010) 1107-1114, M. Reza Afshar, M. Reza Aboutalebi, R. I. L. Guthrie, M. Isac.

In an alternative embodiment, the contamination control arrangement can be used in combination with a mechanical (or other filter) to prevent contamination from passing through or past a certain location using the principles discussed above. In another embodiment, the contamination control arrangement discussed above can be used as a filter or purifier, and not simply to prevent all particles of a certain type from passing through or past a certain location. For example, controlling the movement of contamination may involve controlling the movement of contamination of a certain size, or range of sizes. The applied electromagnetic field strength determines the filtering efficiency and sets a threshold for a certain size of particle. Multiple electromagnetic filters of this type can be use in series in close proximity, and/or at different, relatively remote parts of the radiation source, for example in and/or around the locations shown in other embodiments. Multiple filters can be used for reasons of suppression efficiency and/or size selectivity.

In the embodiments, reference has been made to the fuel being or comprising liquid tin, and contamination being or comprising particles or the like of tin oxide. However, the invention may be applicable to other types of liquid/fuel, for example where the fuel or fluid has a different electrical conductivity in comparison with contamination contained therein, to allow the control discussed above to be successfully implemented. The greater the difference, the easier it is to move the contamination. For instance, the fuel/liquid may be a conductor (e.g., a metal in liquid form), and/or the contamination may be substantially an electrical insulator (e.g., an oxide of that metal).

Controlling movement of the contamination may, in some instances require movement of contamination. In other embodiments, control of movement may equate to maintaining contamination in a stationary position.

Although the abovementioned embodiments have been described in relation to a radiation source, the invention may be applicable and particularly useful in other applications where nozzles for use in fluid stream generators are required, for example in the field of ink-jet printing, or metal printing (e.g., the printing of electrical circuits), or the like. Implementation in relation to a radiation source might be particularly preferred however, given the sensitivity of such apparatus to contamination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

What is claimed is:

1. A radiation source comprising:
a reservoir configured to retain a volume of fuel;
a nozzle, in fluid connection with the reservoir, and configured to direct a stream of fuel along a trajectory towards a plasma formation location;
a laser configured to direct laser radiation at the stream at the plasma formation location to generate, in use, a radiation generating plasma; and
a fuel contamination control arrangement, the contamination control arrangement comprising:
a magnetic field generation element configured to generate a magnetic field;
an electric field generation element, comprising two electrodes disposed outside, and on either side of, the nozzle or a conduit between the reservoir and the nozzle, and configured to generate an electric field;
wherein the magnetic field generation element and the electric field generation element together being configured to ensure that, in use, the magnetic field and the electric field overlap at a location, or a potential location, of contamination within the nozzle or the conduit, and to ensure that lines of flux of the magnetic field and electric field are non-parallel at that location, in order to control movement of the contamination.

2. The radiation source of claim 1, wherein the fuel contamination control arrangement is configured to drive contamination away from passing through the nozzle.

3. The radiation source of claim 1, wherein the fuel contamination control arrangement is configured to drive contamination through the nozzle.

4. The radiation source of claim 1, wherein the nozzle, and/or the conduit, comprises or is in connection with an electromechanical agitator for causing vibration of the nozzle, or fluid contained therein, and wherein the electromechanical agitator is shielded from external electric and/or magnetic fields.

5. The radiation source of claim 1, wherein the magnetic field generation element comprises:
a solenoid that surrounds the location, or the potential location, of contamination within the nozzle or the conduit; and/or
one or more permanent magnets.

6. The radiation source of claim 1, wherein the electric field generation arrangement comprises:
a capacitor, opposite plates of which capacitor are located on substantially opposite sides of the location, or the potential location, of contamination within the nozzle or the conduit.

7. The radiation source of claim 1, wherein the magnetic field generation element and/or the electric field generation element are configured to ensure that, in use, the magnetic field and/or the electric field provide a substantially uniform magnetic field and/or electric field at the location, or the potential location, of contamination within the nozzle or the conduit.

8. The radiation source of claim 1, wherein the contamination control arrangement, or one or more additional contamination control arrangements, function or functions as a filter or purifier within the radiation source.

9. A lithographic apparatus, comprising:
a radiation source comprising:
a reservoir configured to retain a volume of fuel;
a nozzle, in fluid connection with the reservoir, and configured to direct a stream of fuel along a trajectory towards a plasma formation location;
a laser configured to direct laser radiation at the stream at the plasma formation location to generate, in use, a radiation generating plasma; and
a fuel contamination control arrangement, the contamination control arrangement comprising:
a magnetic field generation element configured to generate a magnetic field;
an electric field generation element, comprising two electrodes disposed outside, and on either side of, the nozzle or a conduit between the reservoir and the nozzle, and configured to generate an electric field;
wherein the magnetic field generation element and the electric field generation element together being configured to ensure that, in use, the magnetic field and the electric field overlap at a location, or a potential location, of contamination within the nozzle or the conduit, and to ensure that lines of flux of the magnetic field and electric field are non-parallel at that location, in order to control movement of the contamination;
an illumination system configured to provide a radiation beam from the radiation source;
a patterning device configured to impart the radiation beam with a pattern in its cross-section;
a substrate holder configured to hold a substrate; and
a projection system configured to project the patterned radiation beam onto a target portion of the substrate.

10. The lithographic apparatus of claim 9, wherein the fuel has a different electrical conductivity to that of the contamination.

11. The lithographic apparatus of claim 9, wherein the fuel comprises metal in liquid form, or an intermetallic of a liquid and a metal, or a ceramic, and/or the contamination may comprise an oxide of such metal, intermetallic or ceramic.

12. The lithographic apparatus of claim 9, wherein the fuel comprises tin, and/or wherein the contamination comprises tin oxide.

13. A radiation source comprising:
a reservoir configured to retain a volume of fuel;
a nozzle, in fluid connection with the reservoir, and configured to direct a stream of fuel along a trajectory towards a plasma formation location;
a laser configured to direct laser radiation at the stream at the plasma formation location to generate, in use, a radiation generating plasma; and
a fuel contamination control arrangement, the contamination control arrangement comprising:
a magnetic field generation element configured to generate a magnetic field; and
an electric field generation element, comprising two electrodes disposed outside, and on either side of, the nozzle or a conduit between the reservoir and the nozzle, and configured to generate an electric field, and wherein the magnetic field generation element and/or the electric field generation element being configured to ensure that the generated magnetic field and/or electric field is present at a location, or a potential location, of contamination within the nozzle or the conduit to control movement of the contamination.

* * * * *